United States Patent
Mandelman et al.

(12)

(10) Patent No.: US 6,355,531 B1
(45) Date of Patent: Mar. 12, 2002

(54) METHOD FOR FABRICATING SEMICONDUCTOR DEVICES WITH DIFFERENT PROPERTIES USING MASKLESS PROCESS

(75) Inventors: Jack A. Mandelman, Stormville; Louis L. Hsu, Fishkill; Carl J. Radens, Lagrangeville, all of NY (US); William R. Tonti, Essex Junction, VT (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/634,225

(22) Filed: Aug. 9, 2000

(51) Int. Cl.$^7$ .......................................... H01L 21/8236
(52) U.S. Cl. ...................... 438/276; 438/289; 438/981
(58) Field of Search ............................. 438/217, 275, 438/276, 289, 532, 981

(56) References Cited

U.S. PATENT DOCUMENTS

| | | | |
|---|---|---|---|
| 4,472,871 A | * 9/1984 | Green et al. | 438/276 |
| 5,672,521 A | 9/1997 | Barsan et al. | 438/981 |
| 5,770,493 A | * 6/1998 | Fulford, Jr. et al. | 438/303 |
| 5,827,761 A | * 10/1998 | Fulford, Jr. et al. | 438/305 |
| 5,904,575 A | 5/1999 | Ishida et al. | 438/981 |
| 5,926,708 A | 7/1999 | Martin | 438/275 |
| 6,009,023 A | 12/1999 | Lu et al. | 365/51 |
| 6,027,978 A | * 2/2000 | Gardner et al. | 438/276 |

* cited by examiner

Primary Examiner—Chandra Chaudhari
(74) Attorney, Agent, or Firm—F. Chau & Associates, LLP

(57) ABSTRACT

A method is provided for fabricating semiconductor devices having different properties on a common semiconductor substrate. The method includes the steps of (a) forming N openings on the semiconductor substrate, wherein each opening is corresponding to a channel region of each semiconductor device, (b) forming oxide layers of an $i_{th}$ type on surfaces of the N openings, (c) depositing gate conductor material of an $i_{th}$ type over structure of the semiconductor devices, the gate conductor material of the $i_{th}$ type having a gate conductor work-function of an $i_{th}$ type, (d) removing the gate conductor material of the $i_{th}$ type such that a predetermined amount of the gate conductor material of the $i_{th}$ type remains in an $i_{th}$ opening to form a gate conductor material layer of the $i_{th}$ type on top surface in the $i_{th}$ opening and the gate conductor material of the $i_{th}$ type deposited in the structure other than the $i_{th}$ opening is removed, (e) removing the oxide layers of the $i_{th}$ type from openings other than the $i_{th}$ opening, (f) repeating the steps of (a) through (e) from "i=1" to "i=N", and (g) forming at least one layer on surface of each of N gate conductor material layers in the N openings to form a gate conductor, whereby the N semiconductor devices have N gate conductors, respectively, wherein the N gate conductors have N types of gate conductor work-functions. The semiconductor devices also have channel regions of which doping levels are different from each other by implanting the channel regions with different types of implants.

25 Claims, 9 Drawing Sheets

METHOD FOR FABRICATING SEMICONDUCTOR DEVICES WITH DIFFERENT PROPERTIES USING MASKLESS PROCESS

BACKGROUND OF THE INVENTION

1. Field of the Invention

The present invention relates to a method of manufacturing semiconductor devices having different properties, and more particularly, to a method for fabricating semiconductor devices of different properties without using masks.

2. Description of the Related Art

In semiconductor integrated circuit design having high integration density and functionality, several semiconductor devices having different functions and properties are often formed on a common substrate. For example, the properties of a semiconductor device such as a metal oxide semiconductor field effective transistor (MOSFET), include, for example, a threshold voltage implant, thickness of a gate oxide layer, and gate conductor work-function of the semiconductor device.

In complementary metal oxide semiconductor (CMOS) technology, since disparity is widened between an internal operating voltage and an external operating voltage, MOSFETs having different properties are needed, such as threshold voltages, different gate oxide thickness, and different gate conductor work-functions. For example, MOSFETs used in speed critical devices are customarily required to have properties such as short channels, low threshold voltages, and thin gate oxide layers. On the other hand, MOSFETs for use of interfacing with external circuitry are required to reliably sustain higher voltages so as to have thicker gate oxide layers and longer channels. Furthermore, in dynamic random access memory (DRAM) circuitry, MOSFETs for use in wordline drivers need to have thick gate oxide layers, while MOSFETs for use in high-performance support circuitry need to have thin gate oxide layers. Thus, DRAM circuitry use MOSFETs having different thickness of gate oxide layers. Yet, use of MOSFETs having different properties are needed for sense amplifier devices in circuitry with low standby current. In such circuitry, MOSFETs used in sense amplifier devices require threshold voltages lower than those required by MOSFETs used in other areas of the circuitry.

In conventional methods for fabricating semiconductor devices having different properties on a common substrate, multiple masks, such as block masks, are required, for example, to protect certain portions of a semiconductor device from subsequent processes. In other words, multiple masks are required to tailor specific properties (electrical characteristics) of each semiconductor device to be used for a particular circuit application. For example, block masks (e.g., costly photo-masks) are required for implantation of unique threshold voltage implant into a semiconductor device so that it may have electrical characteristics, such as off-current, threshold voltage, substrate sensitivity, and pinch-off voltage, for a particular circuit operation. When gate oxide reliability is in issue, selective use of specific thickness of gate oxide layers is often required. Gate conductor work-function of each semiconductor device may also be a consideration for increasing a choice of threshold voltages for semiconductor devices on a common semiconductor substrate.

However, in the conventional methods for fabricating semiconductor devices having different properties, the requirement of multiple masks increases the cost for manufacturing the semiconductor devices having different properties.

Therefore, a need exists for a method for fabricating semiconductor devices on a common semiconductor substrate without using multiple masks, wherein the different semiconductor devices have different properties. Thus, the present invention can advantageously reduce the cost for manufacturing the semiconductor devices having different properties owing to use of such maskless processes.

SUMMARY OF THE INVENTION

It is an object of the present invention to provide a method for fabricating semiconductor devices on a common semiconductor substrate, which have different properties, such as different threshold voltages, gate oxide thickness, and gate conductor work-functions.

It is another object of the present invention to provide a method for fabricating semiconductor devices having different properties on a common semiconductor substrate without using multiple masks or masking processes.

To achieve the above and other objects, the present invention provides a method for fabricating semiconductor devices on a semiconductor substrate, wherein properties of the semiconductor devices are different from each other, the method comprising the steps of defining in the semiconductor substrate channel regions which have various lengths, each of the channel regions being formed in a corresponding one of the semiconductor devices; forming an oxide layer on each of the channel regions; and forming a gate conductor material layer on the oxide layer on each of the channel regions, wherein the gate conductor material layer determines a gate conductor work-function of a corresponding semiconductor device. The step of forming an oxide layer preferably includes forming oxide layers on the respective channel regions, the oxide layers having various thickness. The step of forming the gate conductor material layer preferably includes forming gate conductor material layers on the respective oxide layers on the respective channel regions, and the gate conductor material layers have various types of material which determine various types of gate conductor work-functions of the semiconductor devices. A step of implanting the channel regions in sequence may be further included such that the channel regions have doping levels different from each other.

In an aspect of the present invention, there is provided a method for fabricating N semiconductor devices on a semiconductor substrate, wherein properties of the N semiconductor devices are different from each other, the method comprising the steps of (a) forming N openings on the semiconductor substrate, wherein each opening is corresponding to a channel region of each semiconductor device, (b) forming oxide layers of an $i_{th}$ type on surfaces of the N openings, (c) depositing gate conductor material of an $i_{th}$ type over structure of the semiconductor devices, the gate conductor material of the $i_{th}$ type having a gate conductor work-function of an $i_{th}$ type, (d) removing the gate conductor material of the $i_{th}$ type such that a predetermined amount of the gate conductor material of the $i_{th}$ type remains in an $i_{th}$ opening to form a gate conductor material layer of the $i_{th}$ type on top surface in the $i_{th}$ opening and the gate conductor material of the $i_{th}$ type deposited in the structure other than the $i_{th}$ opening is removed, (e) removing the oxide layers of the $i_{th}$ type from openings other than the $i_{th}$ opening, (f) repeating the steps of (a) through (e) from "i=1" to "i=N", and (g) forming at least one layer on surface of each of N gate conductor material layers in the N openings to form a gate conductor, whereby the N semiconductor devices have N gate conductors, respectively, wherein the N gate conductors have N types of gate conductor work-functions.

The method preferably further includes after the step (d) the step of implanting N channel regions of the N semiconductor devices with an $i_{th}$ type implant, whereby augmenting doping levels of channel regions other than first though $i_{th}$ channel regions of first though $i_{th}$ semiconductor devices. An oxide layer in each of the N openings may have a thickness unique to the oxide layer, and the N openings have lengths different from each other. The step (c) preferably includes the step of filling the gate conductor material of the $i_{th}$ type to an extent of completely filling the $i_{th}$ opening. The N openings may have N types of gate conductor material layers, respectively, which are, for example, N types of poly-silicon (or metal) layers. Then, each type of work-function of each semiconductor device is determined by a doping type of a poly-silicon layer of the semiconductor device. The method of the present invention preferably includes in the step of (g) the steps of recessing N gate conductor material layers in the N openings, respectively, and forming the at least one layer on each of the recessed N gate conductor material layers, wherein the at least one layer preferably includes a silicide layer on each of the recessed N gate conductor material layers and an oxide layer on the silicide layer.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiment with reference to the following figures wherein.

DESCRIPTION OF PREFERRED EMBODIMENTS

Detailed illustrative embodiments of the present invention are disclosed herein. However, specific structural and functional details disclosed herein are merely representative for purposes of describing the best embodiment of the present invention.

There are provided below preferred embodiments of the present invention, a method for fabricating semiconductor devices on a common semiconductor substrate without using multiple masks or masking processes, wherein the semiconductor devices have different properties, such as different threshold voltage implants, different gate oxide thickness, and different gate conductor work-functions. For convenience sake in a description, a method for fabricating semiconductor devices on a common semiconductor substrate will be described with respect to three semiconductor devices. However, it should be noted that the number of semiconductor devices formed on a semiconductor substrate may vary depending on functions of circuitry for which the semiconductor devices are used.

Figure 1:
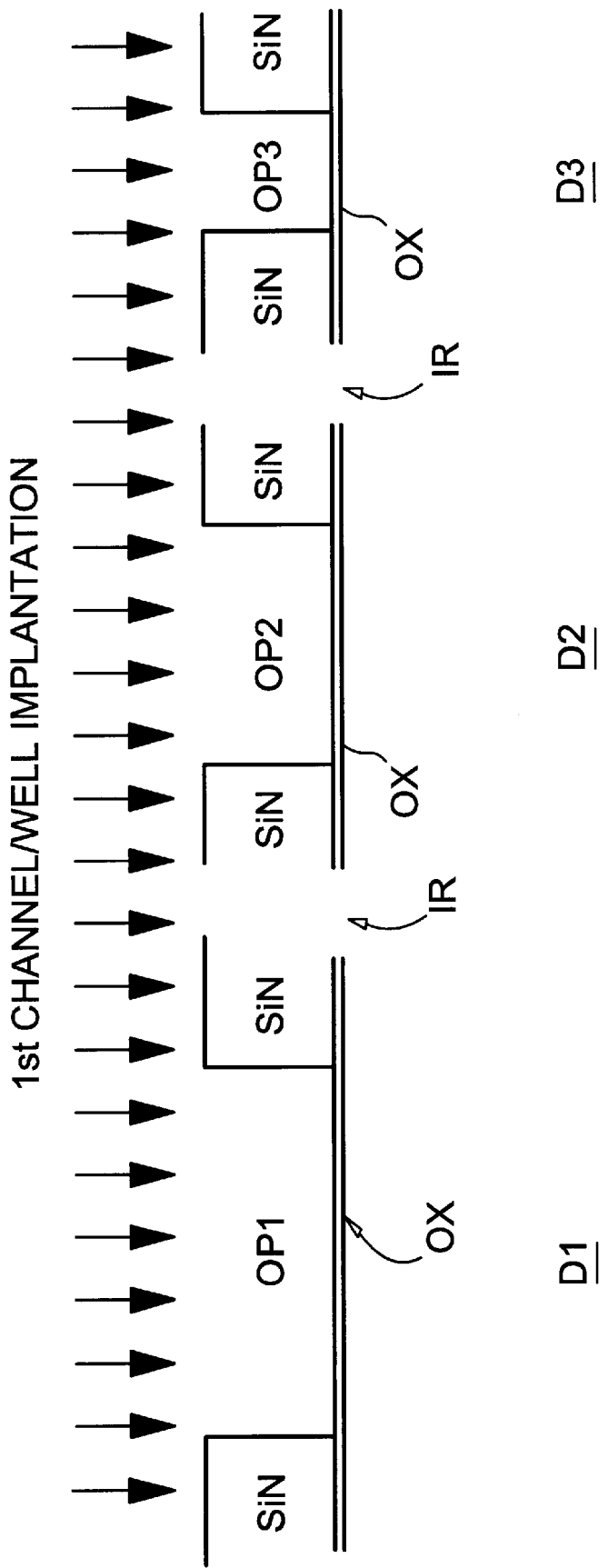
FIG. 1 is a cross-sectional view of semiconductor devices where a first channel/well implantation is performed.

Referring to FIG. 1, there is provided a cross-sectional view of three semiconductor devices on a semiconductor substrate where a first channel implantation is performed. The three devices to be formed through the following processes are, for example, three metal oxide semiconductor field effective transistors (MOSFETs). First, an oxide layer (or pad oxide) is formed on the surface of a semiconductor substrate of which material is preferably silicon. The oxide layer may be as thin as preferably having thickness of about 3 to 20 nano-meters (nm). The oxide layer is formed through, for example, a thermal oxidation process. After forming the oxide layer, a silicon nitride layer is deposited on the surface of the oxide layer using, for example, a chemical vapor deposition (CVD) process that is well known to those in the art. The silicon nitride layer is preferably thicker than the oxide layer, so that its thickness may be, for example, from about 100 nm to about 500 nm.

The pad layers, that is, the oxide layer and the silicon nitride layer, are patterned with a mask to form regions which will contain the MOSFETs. As a result of the MOSFET channel definition process, the pad layers are divided into, for example, three semiconductor devices D1; D2, D3, as shown in FIG. 1. Formation of isolation regions (not shown) in a semiconductor device may be performed prior to formation of the above mentioned pad layers, for example, by a shallow trench isolation process or a local oxidation silicon (LOCOS) process which are well known to those in the art, thus a detailed description thereof is omitted herein. If the shallow trench isolation process is used, the isolation regions are planarized so that their surfaces are coplanar with the surface of the silicon nitride.

With respect to each semiconductor device, an opening is formed in each silicon nitride layer SiN by an etching process, so that the opening is disposed above a corresponding oxide layer OX. Each opening defines a channel length of each semiconductor device (e.g., MOSFET). As shown in FIG. 1, three types of openings OP1, OP2, OP3 are formed in the three devices D1, D2, D3, respectively. A large opening OP1 in the first device D1 is to make a long channel in the first device D1, a medium-sized opening OP2 in the second device D2 is to make a shorter channel in the second device D2, and a small opening OP3 in the third device D3 is to make a shortest channel in the third device D3. By performing the following processes, the three devices D1, D2, D3 (e.g., three MOSFETs) are formed which have different length of channels and different properties, such as different threshold voltages, different gate oxide thickness, and different gate conductor work-function.

After forming the openings OP1, OP2, OP3, a first channel/well implantation is performed into the surfaces of the devices D1, D2, D3, that is, the surfaces of the openings OP1, OP2, OP3, to form doped channel regions in the substrate. The first channel/well implantation is performed without any mask, and preferably performed simultaneously with respect to the three devices D1–D3. In each device, the oxide layer OX serves as a screen layer for the first channel/well implantation. The first channel/well implantation defines a doping level at the surface or deeper into the well of each channel region of the devices. Such defined doping level is common to the three devices D1–D3.

Figure 2:
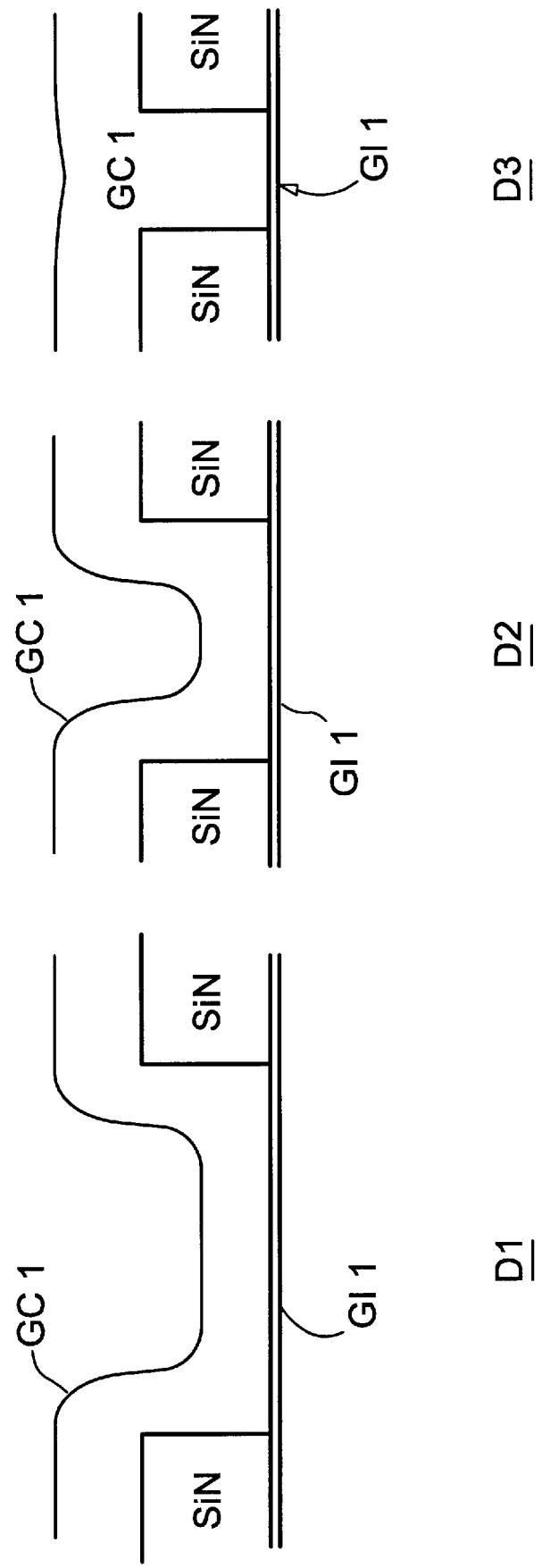
FIG. 2 is a cross-sectional view of semiconductor devices where deposition of first gate conductor material is performed.

Referring to FIG. 2, there is provided a cross-sectional view of the semiconductor devices where deposition of first gate conductor material is performed. The oxide layers OX formed on the semiconductor substrate (referring to FIG. 1) are removed by, for example, a fluorine based etching process. First gate insulators GI1 are formed in the regions where the oxide layers OX have been removed. The first gate insulators GI1 are, for example, another oxide layers formed by a thermal oxidation process. Each first gate insulator GI1 in a device serves as an electrical insulator between a gate conductor (which will be formed by the following process) of the device and a corresponding channel of the device.

After forming the first gate insulators GI1 in the three devices D1–D3, first gate conductor material GC1 is deposited over the surfaces of the silicon nitride layers SiN and the first gate insulators GI1. The first gate conductor material GC1 is, for example, doped poly-silicon. The deposition of the first gate conductor material GC1 is preferably performed simultaneously over the surfaces of the devices D1–D3. The first gate conductor material GC1 has a first gate conductor work-function representing a first type of functional characteristics of a gate conductor. The first gate conductor work-function is determined by a type of material and/or doping of the first gate conductor material GC1 (e.g., poly-silicon). Doping for the first gate conductor material GC1 may be introduced during deposition by an insitu process, or following deposition by ion-implantation, gaseous or solid source doping.

The first gate conductor material GC1 is deposited to the extent of completely filling the smallest opening OP3, while leaving a conformal layer on the bottom and side-wall surfaces of the large and medium-sized openings OP1, OP2. The conformal layer is formed on the surfaces of the devices D1, D2, having substantially uniform thickness with respect to the horizontal and vertical surfaces of the devices D1, D2. The thickness of the fist gate conductor material GC1 may be determined depending on a channel length of each device (e.g., MOSFET). For example, for semiconductor devices (e.g., MOSFETs) having a medium channel length of about 250 nm and a short channel length of about 150 nm, the thickness of the first gate conductor material GI1 is greater than about 75 nm and less than about 125 nm.

Figure 3:
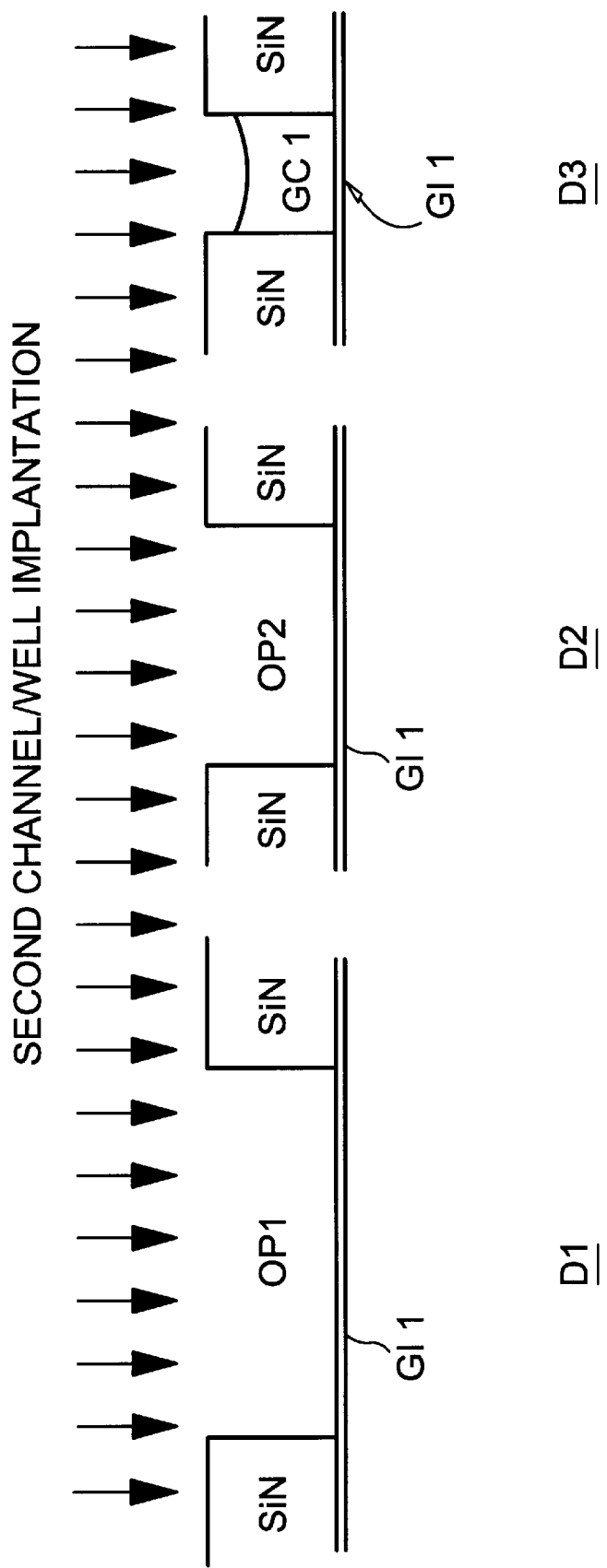
FIG. 3 is a cross-sectional view of semiconductor devices where a second channel/well implantation is performed.

Referring to FIG. 3, there is provided a cross-sectional view of the semiconductor devices where a second channel/well implantation is performed. The first gate conductor material GC1 has been removed by, for example, an isotropic etching process. In the first and second devices D1, D2, the first gate conductor material GC1 is completely removed so as to leave the void openings OP1, OP2. In the third device D3, some portion of the first gate conductor material GC1 remains in the opening OP3.

A second channel/well implantation is performed with respect to all the three semiconductor devices D1–D3. In the first and second devices D1, D2, the second channel/well implantation is performed into the channel regions (i.e., the first gate insulators GI1) of the devices D1, D2. In the third device D3, the second channel/well implantation is performed on the surface of the first gate conductor material GC1 deposited in the third device D3. As a result, the second channel/well implantation augments doping in the channel regions of the first and second devices D1, D2, but does not change doping level in the channel region of the third device D3 because the second channel/well implantation is blocked by the first gate conductor material GC1 deposited on the channel region of the device D3. Since channel doping concentrations (about $5 \times 10^{17}$ cm$^{-3}$) are typically much lower than gate conductor doping concentrations (about $5 \times 10^{20}$ cm$^{-3}$), introduction of a channel doping implant into the first gate conductor material GC1 of the third device D3 has a negligible effect on the total doping in the first gate conductor material GC1 of the third device D3. After completing the second channel/well implantation, the first gate insulators GI1 in the first and second devices D1, D2 are removed by an etching process. The first gate insulators GI1 in the first and second devices D1, D2 were used as screen layers for the second channel/well implantation.

Figure 4:
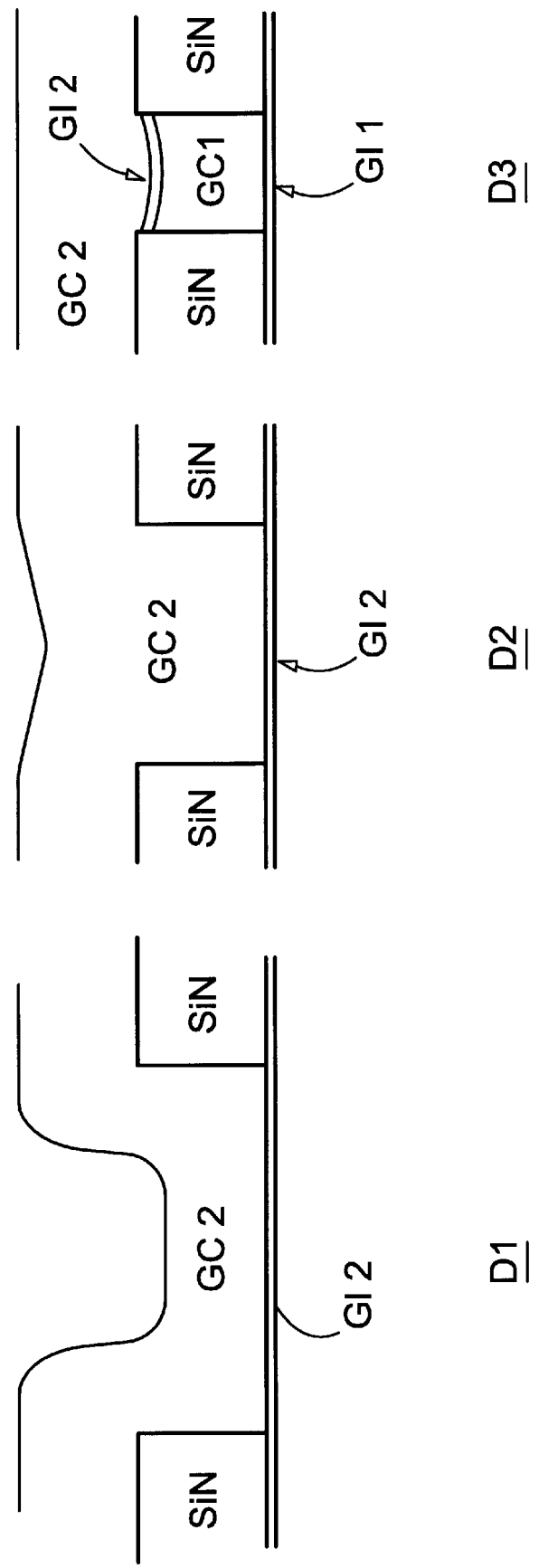
FIG. 4 is a cross-sectional view of semiconductor devices where deposition of second gate conductor material is performed.

Referring to FIG. 4, there is provided a cross-sectional view of the semiconductor devices where deposition of second conductor material is performed. In each device, a second gate insulator GI2 is formed, for example, by a thermal oxidation process. In the first and second devices D1, D2, the second gate insulators GI2 are formed on the regions where the first gate insulators GI1 have been removed. In the third device D3, the second gate insulator GI2 is formed on the surface of the first gate conductor material GC1 previously deposited on the channel region of the device D3. The second gate insulators GI2 may have thickness different from that of the first gate insulators GI1. The thickness of the gate insulators (either the first or second gate insulators GI1 or GI2) may be differently determined by using a different thermal oxidation process which has different values for parameters, such as time, temperature, and ambient. The thickness of a gate insulator in a semiconductor device also affects a threshold voltage of the semiconductor device. A thickness of a gate insulator and a level of a threshold voltage of a semiconductor are directly proportional.

After forming the second gate insulators GI2 (e.g., oxide layers) on the surfaces of the three devices D1, D2, D3, second gate conductor material GC2 is deposited over the surfaces of the three devices D1, D2, D3, that is, over the surfaces of the silicon nitride layers SiN and the second gate insulators GI2 in the three semiconductor devices D1, D2, D3. As a result, in the third device D3, the second gate conductor material GC2 is deposited on the second gate insulator GI2 which has been formed on the first gate conductor material GC1. The second gate conductor material GC2 is, for example, doped poly-silicon. The second gate conductor material GC2 may be doped by an insitu process during or following the deposition. The deposition of the second gate conductor material GC2 is preferably performed simultaneously over the surfaces of the devices D1–D3. The second gate conductor material GC2 has a second gate conductor work-function representing a second type of functional characteristics of a gate conductor, which is determined by a type of material and/or doping of the second gate conductor material GC2 (e.g., poly-silicon). The second gate conductor work-function is preferably different from the first gate conductor work-function. The second gate conductor material GC2 is deposited to the extent of completely filling the opening OP2 of the second device D2, while a conformal layer remains on the bottom and side-wall surfaces of the opening OP1 of the first device D1. Thickness of the second gate conductor material GC2 is determined depending on a channel length of each semiconductor device (e.g., MOSFET). For example, for semiconductor devices having a long channel length of about 500 nm and a medium channel length of about 250 nm, the thickness of the second gate conductor material is greater than about 125 nm and less than about 250 nm.

Figure 5:
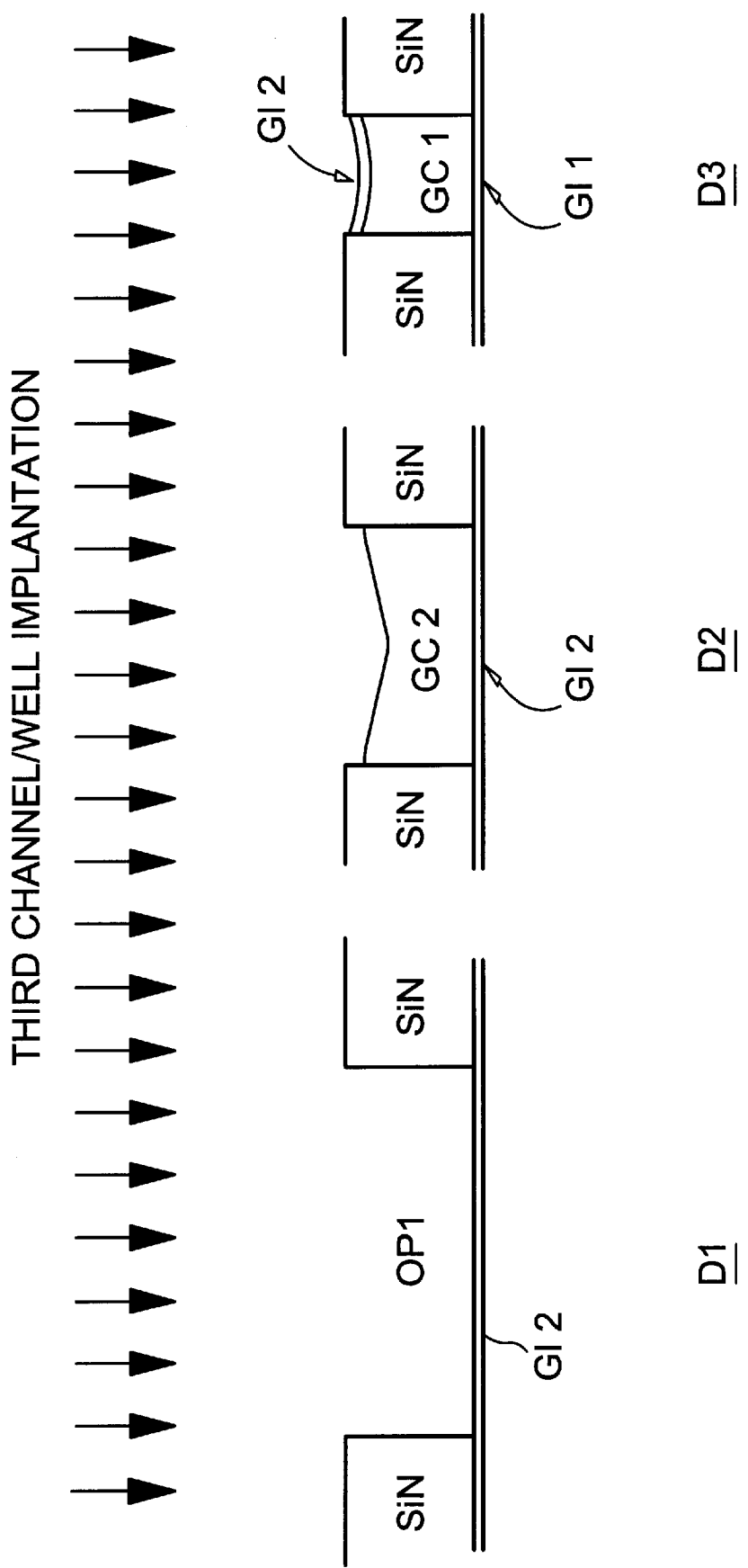
FIG. 5 is a cross-sectional view of semiconductor devices where a third channel/well implantation is performed.

Referring to FIG. 5, there is provided a cross-sectional view of the semiconductor devices where a third channel/well implantation is performed. The second gate conductor material GC2 is removed by, for example, an isotropic etching process which is selective to oxide and nitride. In the first and third devices D1, D3, the second gate conductor material GC2 is completely removed so as to leave the void opening OP1 in the first device D1 and no residual on the top of the second gate insulator GI2 in the third device D3. In the third device D3, the second gate insulator GI2 serves as an etch stop layer for preventing removal of the first gate conductor material GC1. In the second device D2, some portion of the second gate conductor material GC2 remains in the opening OP2 after the etching process.

A third channel/well implantation is then performed with respect to the three semiconductor devices D1, D2, D3. In other words, the third channel/well implantation is performed into the channel region (i.e., through the second gate insulator GI2) of the first device D1, into the surface of the second gate conductor material GC2 in the second device D2, and into the surface of the second gate insulator GI2 deposited on the first gate conductor material GC1 in the third device D3. The third channel/well implantation augments doping in the channel region of the first device D1, but does not change doping in the channel regions of the second and third devices D2, D3 because the third channel/well implantation is blocked by the second gate conductor material GC2 and the first gate conductor material GC1 in the second and third devices D2, D3, respectively. Furthermore, the third channel/well implantation negligibly effects the total doping concentration in the first and second gate conductor materials GC1, GC2. The second gate insulators GI2 in the first and third devices D1, D3 serve as screen layers for the third channel/well implantation and are removed after completing the third channel/well implantation.

Figure 6:
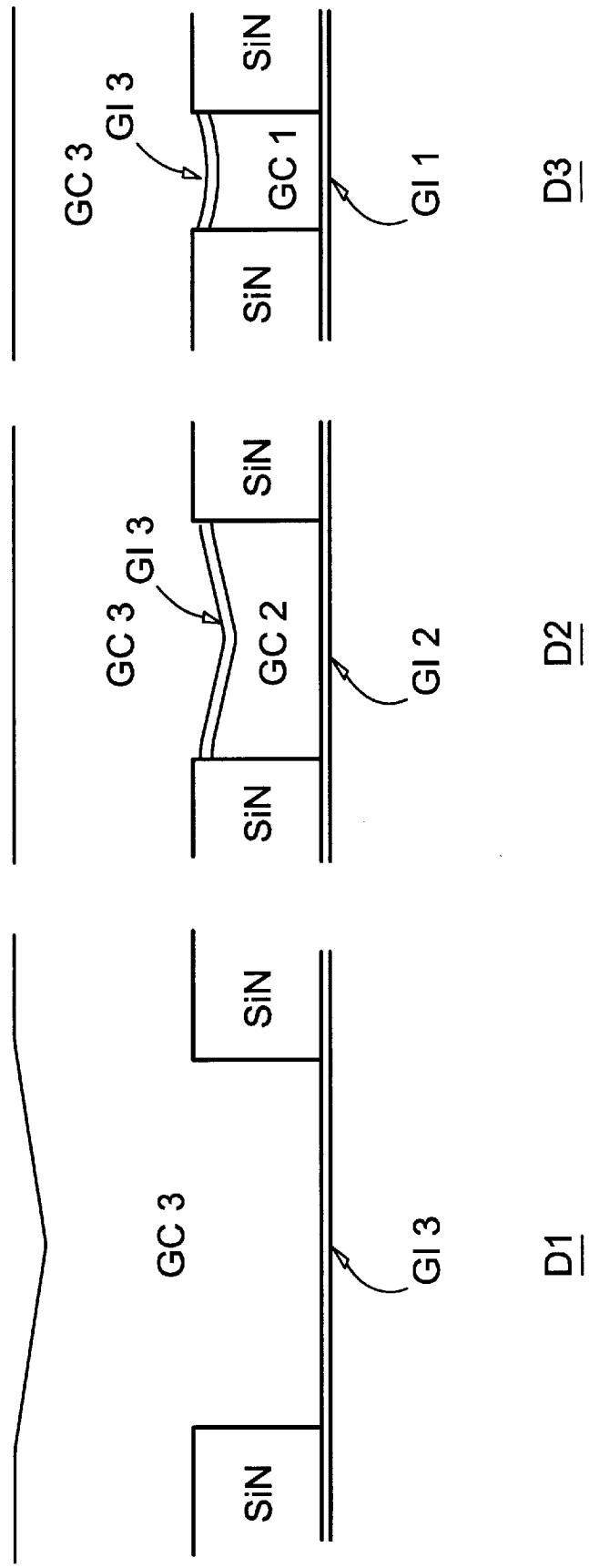
FIG. 6 is a cross-sectional view of semiconductor devices where deposition of third gate conductor material is performed.

Referring to FIG. 6, there is provided a cross-sectional views of the semiconductor devices where deposition of third gate conductor material is performed. After removing the second gate insulators GI2 in the first and third devices D1, D3 by an etching process, third gate insulators GI3 are formed on the surfaces of the semiconductor devices D1, D2, D3, for example, by a thermal oxidation process. In the first device D1, a third gate insulator GI3 is formed in the region where the second gate insulator GI2 has been removed, which is the surface of the channel region of the first device D1. In the second device D2, a third gate insulator GI3 is formed on the surface of the second gate conductor material GC2. In the third device D3, a third gate insulator GI3 is formed on the surface of the first gate conductor material GC1, where the second gate insulator GI2 has been removed.

After forming the third gate insulators GI3, third gate conductor material GC3 is deposited over the surfaces of the semiconductor devices D1, D2, D3, that is, the surfaces of the silicon nitride layers SiN and the third gate insulators GI3. The third gate conductor material GC3 is, for example, doped poly-silicon, and may be doped by an insitu process during or following the deposition. The deposition of the third gate conductor material GC3 is preferably performed simultaneously with respect to the three devices D1–D3. The third gate conductor material GC3 has a third gate conductor work-function, which is determined by a type of material and/or doping of the third gate conductor material GC3 (i.e., poly-silicon). The third gate conductor material GC3 is deposited to the extent of completely filling the opening OP3 of the first device D3.

Figure 7:
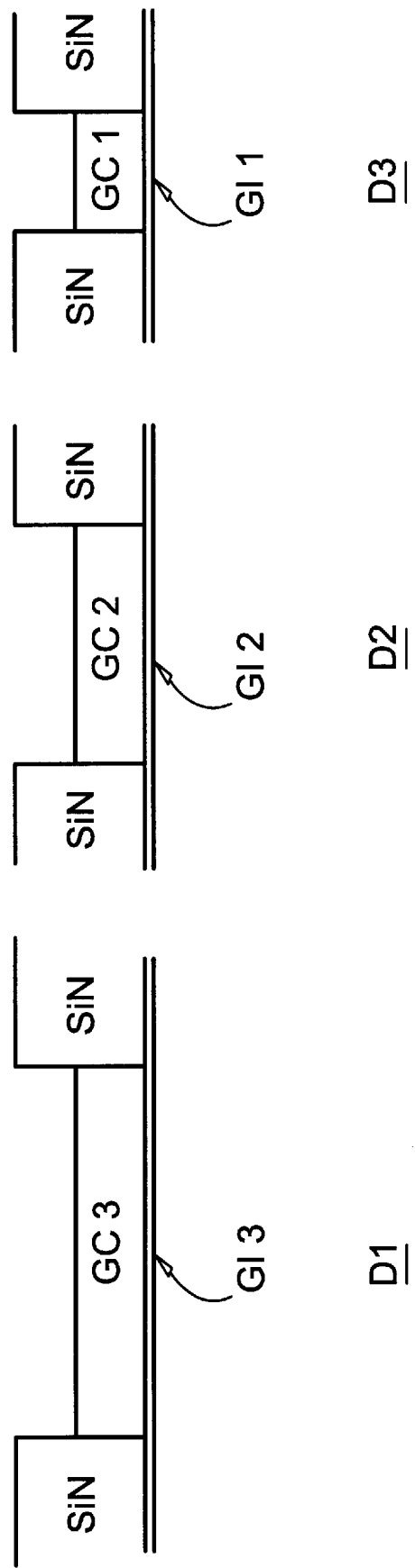
FIG. 7 is a cross-sectional view of semiconductor devices where planarization and recessing of the gate conductor materials are performed.

Referring to FIG. 7, there is provided a cross-sectional view of the semiconductor devices where planarization and recessing of the gate conductor materials are performed. In each of the three semiconductor devices D1–D3, the third gate conductor material GC3 is planarized to the top surfaces of the silicon nitride layers SiN, and then a reactive ion etch process is performed to remove the third gate conductor material GC3. As a result of the reactive ion etch process, the third gate conductor materials GC3 on the surface of the second gate conductor material GC2 in the second device D2 and on the surface of the first gate conductor material GC1 in the third devices D3 are substantially completely removed, while the third gate conductor material GC3 remains in the first device D1.

Upon performing the reactive ion etch process, the third gate insulators GI3 in the second and third semiconductor devices D2, D3 are removed by an etching process. The gate conductor materials GC3, GC2, GC1 are then recessed below the top surfaces of the silicon nitrides SiN in the three devices D1, D2, D3, respectively. The recessing of the gate conductor materials GC3, GC2, GC1 are performed to extent that each of the recessed gate conductor materials GC3, GC2, GC1 has a predetermined thickness.

Figure 8:
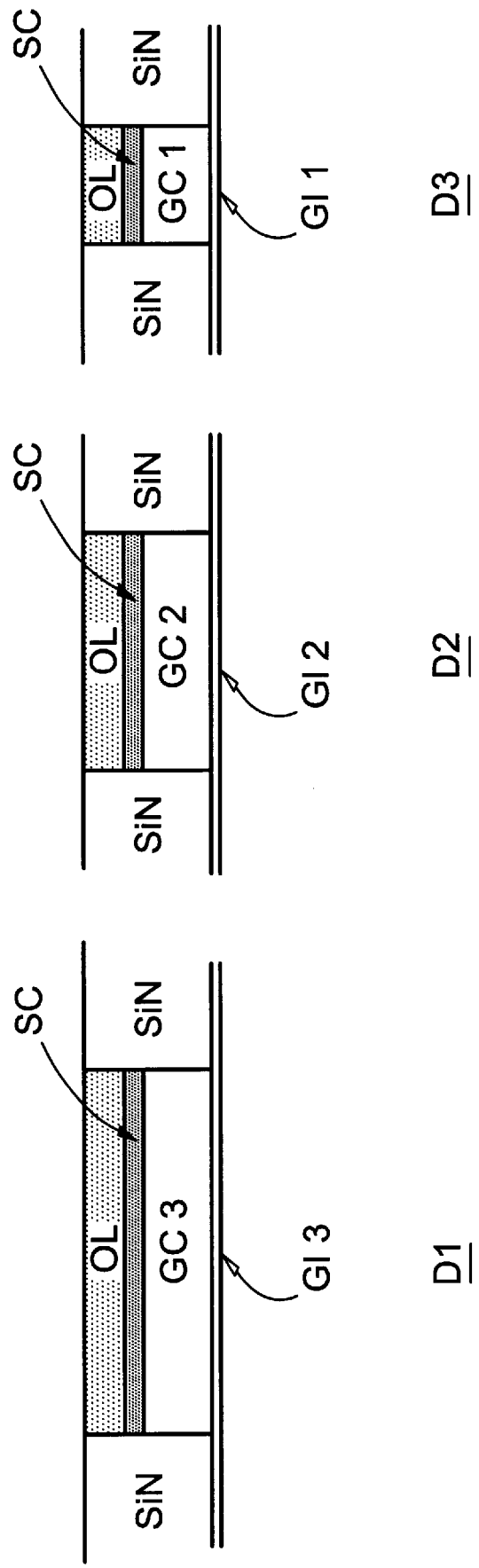
FIG. 8 is a cross-sectional view of semiconductor devices where silicide layers and oxide layers are formed.

Referring to FIG. 8, there is provided a cross-sectional view of the semiconductor devices where silicide layers and oxide layers are formed on the surfaces of the gate conductor materials. On the exposed surfaces of the gate conductor materials GC3, GC2, GC1 in the devices D1, D2, D3, silicide layers SC are formed, for example, when the gate conductor material is poly-silicon. The deposited silicide layers SC are then planarized and recessed below the top surfaces of the silicon nitride layers SiN. A series of processes of the deposition, planarization, and recessing of a silicide layer is well known in this art, thus a detailed description thereof is omitted herein.

Alternatively, the silicide layers SC may be formed by performing deposition of refractory metal, reaction of the refractory metal with poly gate, and removal of unreacted metal using a selective etch process. A series of the deposition, reaction, and removal processes using the refractory metal is also well known in this art, thus a detailed description thereof is omitted herein.

Upon forming the silicide layers SC, oxide layers OL are deposited on the surfaces of the silicide layers SC through, for example, a chemical vapor deposition (CVD) process. The oxide layers OL are then planarized to the surfaces of the silicon nitride layers SiN to form oxide caps on gate conductors of the semiconductor devices D1, D2, D3.

Preferably, interlayer conductive diffusion barriers may be formed on the surfaces of the gate conductor materials GC3, GC2, GC1, respectively, before forming the silicide layers SC thereon. The interlayer conductive diffusion barriers, for example TiN or TaSiN, are to prevent outdiffuision of dopant from poly-silicon into the silicide layers.

Figure 9:
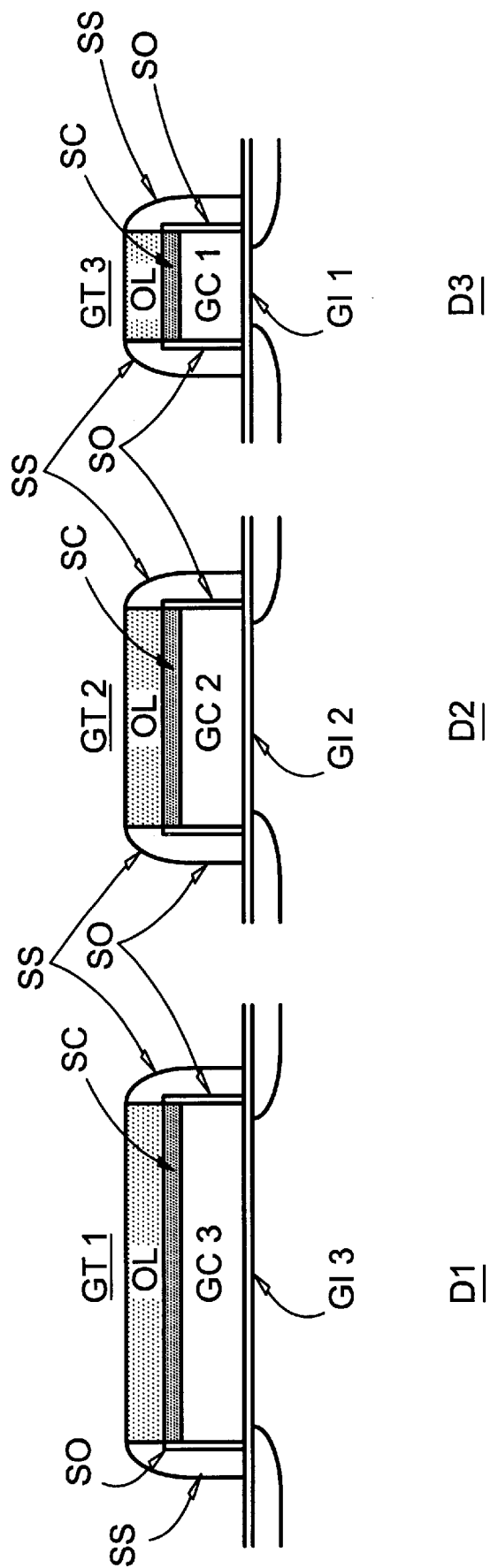
FIG. 9 is a cross-sectional view of semiconductor devices where gate side-walls are formed on the side surfaces of gate conductors.

Referring to FIG. 9, there is provided a cross-sectional view of the semiconductor devices where gate side-walls are formed on the side surfaces of gate conductors. After forming the oxide layers OL on the top surfaces of the channel regions in the devices D1, D2, D3, the silicon nitride layers SiN are removed by an etching process. After removing the silicon nitride layers SiN, gate side-walls are formed on the side surfaces of gate conductors GT1, GT2, GT3 in the devices D1, D2, D3. First, on the side surfaces of the gate conductors GT1, GT2, GT3, side-wall oxide layers SO are formed by an oxidation process, and then side-wall spacers SS are formed over the side-wall oxide layers SO, respectively. The side-wall spacers SS are, for example, silicon nitride layers or oxide layers. Each of the side-wall spacers SS is preferably thicker than each of the side-wall oxide layers SO.

It is noted that between the processes of forming the side-wall oxide layers SO and forming the side-wall spacers SS, source-drain junction implantation may be performed. In the source-drain junction implantation, doping of source-drain diffusions may be performed independent of the gate work-functions of the gate conductors GT1, GT2, GT3. Thus, in fabricating semiconductor devices by the method according to the present invention, it is possible to form "P+" gated N-type field effect transistors (NFETs) and "N+" gated P-type field effect transistors (PFETs) as well as "N+" gated NFETs and "P+" gated PFETs.

As a result of the processes above described, each of the three semiconductor devices D1–D3 has a gate conductor and gate side-walls. In other words, the first gate conductor GT1 in the first device D1 with a long channel region is formed with the layers of the third gate conductor material GC3, the silicide layer SC, and the oxide layer OL; the second gate conductor GT2 in the second device D2 with a medium-sized channel region is formed with the layers of the second gate conductor material GC2, the silicide layer SC, and the oxide layer OL; and the third gate conductor GT3 in the third device D3 with a short channel region is formed with the layers of the first gate conductor material GC1, the silicide layer SC, and the oxide layer OL.

Therefore, the semiconductor devices (e.g., MOSFETs) fabricated by the method according to the present invention have properties, such as threshold voltage implants, gate oxide thickness, and gate conductor work-functions, which are different device by device. Such semiconductor devices advantageously provide flexibility in designing electronic circuitry, so that circuit designers may have a much wider range of device types from which to choose. Also, since the method of the present invention does not require multiple masks or masking processes, it costs less as compared with conventional methods where multiple masks or masking processes are required.

Having described preferred embodiments of a method for fabricating semiconductor devices having different properties according to the present invention, modifications and variations can be readily made by those skilled in the art in light of the above teachings. For example, although doped poly-silicon is used as the gate conductor material for the best embodiment of the present invention, other materials may also be used as the gate conductor material. It is therefore to be understood that, within the scope of the appended claims, the present invention can be practiced in a manner other than as specifically described herein.

What is claimed is:

1. A method for fabricating a plurality of semiconductor devices on a semiconductor substrate, wherein properties of the plurality of semiconductor devices are different from each other, the method comprising the steps of:

defining in the semiconductor substrate a plurality of channel regions which have various lengths, each of the plurality of channel regions being formed in a corresponding one of the plurality of semiconductor devices;

forming various types of doped channel regions by performing in sequence various channel implant processes with respect to the plurality of channel regions, wherein each of the various types of doped channel regions has a different doping level determined by corresponding one of the various channel implant processes which are free from an implant mask;

forming an oxide layer on each of the doped channel regions; and forming a gate conductor material layer on the oxide layer on each of the doped channel regions, wherein the gate conductor material layer determines a gate conductor work-function of a corresponding semiconductor device.

2. The method as defined in claim 1, wherein the step of forming an oxide layer includes forming a plurality of oxide layers on the respective channel regions, the plurality of oxide layers having various thickness.

3. The method as defined in claim 2, wherein the step of forming the gate conductor material layer includes forming a plurality of gate conductor material layers on the respective oxide layers on the respective channel regions, the plurality of gate conductor material layers having various types of material which determine various types of gate conductor work-functions of the plurality of semiconductor devices.

4. The method as defined in claim 1, wherein the step of forming various types of doped channel regions includes the steps of:

performing a first maskless implant process with respect to the plurality of channel regions;

performing a second maskless implant process with respect to the plurality of channel regions including at least one channel region covered with a gate conductor material layer, wherein the at least one channel region becomes at least one first type doped channel region; and performing a third maskless implant process with respect to the plurality of channel regions including the at least one first type doped channel region and at least one channel region covered with another gate conductor material layer, wherein the at least one channel region covered with another gate conductor material layer becomes at least one second type doped channel region.

5. A method for fabricating N semiconductor devices on a semiconductor substrate, wherein properties of the N semiconductor devices are different from each other, the method comprising the steps of:

(a) forming N openings on the semiconductor substrate, wherein each opening is corresponding to a channel region of each semiconductor device;

(b) forming oxide layers of an $i_{th}$ type on surfaces of the N openings;

(c) depositing gate conductor material of an $_i$h type over structure of the semiconductor devices, the gate conductor material of the $i_{th}$ type having a gate conductor work-function of an $i_{th}$ type;

(d) removing the gate conductor material of the $i_{th}$ type such that a predetermined amount of the gate conductor material of the $i_{th}$ type remains in an $i_{th}$ opening to form a gate conductor material layer of the $i_{th}$ type on top surface in the $i_{th}$ opening and the gate conductor material of the $i_{th}$ type deposited in the structure other than the $i_{th}$ opening is removed;

(e) removing the oxide layers of the $i_{th}$ type from openings other than the $i_{th}$ opening;

(f) repeating the steps of (a) through (e) from "i =1" to "i=N"; and (g) forming at least one layer on surface of each of N gate conductor material layers in the N openings to form a gate conductor, whereby the N semiconductor devices have N gate conductors, respectively, wherein the N gate conductors have N types of gate conductor work-functions.

6. The method as defined in claim 5, further including after the step (d) the step of implanting N channel regions of the N semiconductor devices with an $i_{th}$ type implant, whereby augmenting doping levels of channel regions other than first though $i_{th}$ channel regions of first though $i_{th}$ semiconductor devices.

7. The method as defined in claim 6, wherein the N channel regions of the N semiconductor devices have N types of doping levels, respectively.

8. The method as defined in claim 5, wherein an oxide layer in each of the N openings has a thickness unique to the oxide layer.

9. The method as defined in claim 8, wherein a thickness of each of the oxide layers is determined by parameters of an oxidation process, wherein the parameters include time, temperature, and ambient.

10. The method as defined in claim 5, wherein the N openings have lengths different from each other.

11. The method as defined in claim 5, wherein the step (a) includes the steps of:

forming an oxide layer on the semiconductor substrate;

depositing a silicon nitride layer on surface of the oxide layer; and forming the N openings in the silicon nitride layer by an etching process.

12. The method as defined in claim 11, further including the step of implanting the semiconductor substrate in the N openings to form N channel regions commonly doped in the N semiconductor devices, respectively.

13. The method as defined in claim 5, wherein the step (c) includes the step of filling the gate conductor material of the $i_{th}$ type to an extent of completely filling the $i_{th}$ opening.

14. The method as defined in claim 13, wherein conformal layers of the gate conductor material of the $i_{th}$ type are formed in openings other than first through $i_{th}$ openings, wherein each of the conformal layers has a substantially uniform thickness with respect to horizontal and vertical surfaces of a corresponding opening.

15. The method as defined in claim 5, wherein the N openings have N types of gate conductor material layers, respectively, wherein the N types of gate conductor material layers are N types of poly-silicon layers.

16. The method as defined in claim 15, wherein each type of work-function of each semiconductor device is determined by a doping type of a poly-silicon layer of the semiconductor device.

17. The method as defined in claim 5, wherein the step of (g) includes the steps of:

recessing N gate conductor material layers in the N openings, respectively; and forming the at least one layer on each of the recessed N gate conductor material layers.

18. The method as defined in claim 17, wherein the step of forming the at least one layer includes the steps of:

forming a silicide layer on each of the recessed N gate conductor material layers; and forming an oxide layer on the silicide layer formed on each of the recessed N gate conductor material layers.

19. The method as defined in claim 17, wherein the step of forming the at least one layer includes the steps of:

depositing refractory metal on surface of each of the recessed N gate conductor material layers;

reacting the refractory metal with poly gate; and removing unreacted metal using a selective etching process.

20. The method as defined in claim 17, further including the step of forming an interlayer conductive diffusion barrier between the at least one layer and each of the recessed N gate conductor material layers.

21. The method as defined in claim 20, wherein the interlayer conductive diffusion barrier is one of TiN and TaSiN.

22. The method as defined in claim 5, further including after the step (g) the steps of:

removing silicon nitride layers surrounding the N gate conductors; and forming gate side-walls on side surfaces of each gate conductor.

23. The method as defined in claim 22, wherein the step of forming the gate side-walls includes the steps of:

forming a side-wall oxide layer on each of side surfaces of the N gate conductors; and forming a side-wall spacer on the side-wall oxide layer on each of the side surfaces of the N gate conductors.

24. The method as defined in claim 5, further including the step of performing source-drain junction implantation in each semiconductor device independent of a gate work-function of the semiconductor device.

25. The method as defined in claim 4, further including the steps of performing in sequence the forth through the $N_{th}$ maskless implant processes in like manner as the steps of performing the first through third maskless implant processes to form the forth through $N_{th}$ types of doped channel regions.

* * * * *